(12) United States Patent
Tokushima

(10) Patent No.: US 6,558,881 B2
(45) Date of Patent: May 6, 2003

(54) METHOD OF EXPOSING A LATTICE PATTERN ONTO A PHOTO-RESIST FILM

(75) Inventor: Masatoshi Tokushima, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 10/154,789

(22) Filed: May 28, 2002

(65) Prior Publication Data

US 2002/0172901 A1 Nov. 21, 2002

Related U.S. Application Data

(63) Continuation of application No. 09/436,722, filed on Nov. 9, 1999, now abandoned.

(30) Foreign Application Priority Data

Nov. 9, 1998 (JP) .............................. 10-317698

(51) Int. Cl.[7] .............................. G03F 9/00; G03B 27/46
(52) U.S. Cl. ...................... 430/394; 430/312; 430/322; 430/5; 355/53; 355/77
(58) Field of Search .................. 430/312, 394, 430/322, 5; 355/53, 77

(56) References Cited

U.S. PATENT DOCUMENTS

| 4,402,571 | A | | 9/1983 | Cowan et al. ......... 350/162.17 |
| 5,739,898 | A | | 4/1998 | Ozawa et al. ................ 355/53 |
| 5,863,677 | A | | 1/1999 | Nakao ............................ 430/5 |
| 5,965,327 | A | * | 10/1999 | Kuboya et al. ............. 430/312 |
| 6,094,256 | A | * | 7/2000 | Grodnensky et al. ......... 355/77 |

FOREIGN PATENT DOCUMENTS

| JP | 62-45026 | 2/1987 |
| JP | 63-232318 | 9/1988 |
| JP | A 63-232318 | 9/1988 |
| JP | A 1-283925 | 11/1989 |
| JP | 4-186244 | 7/1992 |
| JP | 4-273245 | 9/1992 |
| JP | 5-121291 | 5/1993 |
| JP | 5-197126 | 8/1993 |
| JP | 6-151269 | 5/1994 |
| JP | 7-505507 | 6/1995 |
| JP | 7-211619 | 8/1995 |
| JP | 8-45818 | 2/1996 |
| JP | 11-15138 | 1/1999 |

* cited by examiner

Primary Examiner—Mark F. Huff
Assistant Examiner—Daborah Chacko-Davis
(74) Attorney, Agent, or Firm—Young & Thompson

(57) ABSTRACT

The present invention provides a method of optical exposure to form a lattice pattern on a photo-resist, wherein at least two times of multiple exposure are carried out by use of different patterns.

20 Claims, 19 Drawing Sheets

METHOD OF EXPOSING A LATTICE PATTERN ONTO A PHOTO-RESIST FILM

BACKGROUND OF THE INVENTION

The present invention relates to a method of exposing a lattice pattern onto a photo-resist film, and more particularly to a method of exposing a lattice pattern onto a photo-resist film by use of an optical exposure system.

Manufacturing processes for semiconductor devices my be classified into main three processes of process for forming films, process for etching to the films and lithography processes. A typical one of the lithography process is carried out as follows. An organic film so called to as a photo-resist film is formed over a substrate. An exposure system so called to as a stepper is used to irradiating a light or an X-ray through an exposure mask having a pattern of light shielding material onto the photo-resist film, so that either an exposed part or an unexposed part of the photo-resist film is selectively removed by a development, thereby to form the same pattern as the exposure mask pattern or scale-reduced pattern over the substrate. Other lithography process is to use an electron beam. An organic film so called to as a resist film is formed over a substrate. An electron beam is continuously irradiated onto the organic film with one stroke, so that either an exposed part or an unexposed part of the resist film is selectively removed by a development, thereby to form the same pattern as the exposure mask pattern or scale-reduced pattern over the substrate.

The exposure includes both irradiation of light or X-ray and irradiation of electron beam.

It is often required to form lattice patterns which comprise regular lattice alignments of fine patterns which are geometrically shaped. Particularly, two-dimensional periodically-structured photonic crystal is one of optical devices which need fine lattice patterns. Those lattice patterns are, for example, tetragonal lattices, hexagonal lattices, and honeycomb-structured lattices. FIG. 10 is a diagram illustrative of a fine tetragonal lattice of circles. FIG. 11 is a diagram illustrative of a fine hexagonal lattice of circles. FIG. 12 is a diagram illustrative of a fine honeycomb-structured lattice of circles.

It is most important for realizing those fine lattice pattern that possible fine photo-resist patterns are formed as accurately in size as possible.

In the semiconductor field, the most frequently used optical exposure system is the stepper which utilizes g-ray having a wavelength of 486 nanometers or i-ray having a wavelength of 356 nanometers. The exposure is carried out to irradiate those ray through the exposure mask having the same size pattern or an enlarged size pattern directly onto the photo-resist film for direct patterning to the photo-resist pattern. If those exposure systems are used, the minimum size of lattice point for possible patterning to the photo-resist depends upon the wavelength of the used light both when the photo-resist remains after development and when the photoresist is removed after development. As the wavelength of the used light is short, the minimum size of the lattice point of the photo-resist lattice pattern is also made fine. For example, it is easy for using the i-ray to minimize the size of the lattice point of the photo-resist lattice pattern rather than when the g-ray is used. If a further minimization of the size of the lattice point of the photo-resist lattice pattern under the condition of using the i-ray stepper, it is possible to use a super resolution technique such as a phase shift mask. If further more fine lattice pattern is required to be formed by use of the optical exposure system, it is possible to use a KrF excited dimer laser having a wavelength of 249 nanometers.

The above method of transferring the lattice pattern of the exposure mask onto the resist by use of g-ray, i-ray, and KrF excited dimer laser has the limitation to minimize the size of the lattice point. It is difficult for this method to form the above fine lattice patterns for photonic crystal. Either when the photo-resist remains after development or when the photo-resist is removed after development, the minimum size of the lattice point by use of g-ray is about 0.7 micrometers. The minimum size of the lattice point by use of i-ray is about 0.5 micrometers. The minimum size of the lattice point by use of KrF excited dimer laser is about 0.45 micrometers. When the i-ray is used together with the phase shift mask, the minimum size of the lattice point is about 0.45 micrometers. A phase shift mask for KrF excited dimer laser has not yet been developed due to technical difficulty. When the photonic crystals of cylindrically shaped which form hexagonal lattice as shown in FIG. 11 are applied, then the diameter of the cylindrically shaped lattice points is ranged about 0.25 micrometers through 0.4 micrometers, which are smaller than the above minimum size obtained by the optical exposure.

X-ray exposure and electron beam exposure have been known in the art to which the invention pertains. The wavelength of X-ray and the de-Broglie wavelength are sufficiently smaller than wavelengths of g-ray, i-ray and KrF excited dimer lasers. The minimum diameter of the circle-shaped lattice point formed by the X-ray exposure is 0.1 micrometer which may be applicable to the two-dimensional periodically-structured photonic crystal. The minimum diameter of the circle-shaped lattice point formed by the electron beam exposure is not more than 0.1 micrometer which also may be applicable to the two-dimensional periodically-structured photonic crystal.

The X-ray exposure has a problem with difficulty in forming the X-ray mask. The X-ray mask comprises a thin base layer of Si having a thickness of about 2 micrometers and a heavy metal pattern such as Au pattern having a thickness of about 1 micrometer which is formed on the thin base layer. The X-ray mask is so thin as being difficult to control or suppress the strain of the X-ray mask. The manufacturing cost for the X-ray mask is much higher than that of the optical exposure mask. As the X-ray source, a synchrotron radiation source is used, which is extremely large and expensive instrument as compared to the stepper used as the optical exposure system. The use of the X-ray exposure to form the fine lattice pattern causes the problem with the increased manufacturing cost.

On the other hand, the electron beam exposure has another problem with difficulty in exposure over a large area. One electron beam scanning is capable of exposure over not more than a few hundred micrometers square. If larger area is required to be exposed to the electron beam, then it is possible to divide the exposure-required large area into a plurality of small exposure areas, each of which has an area of not more than a few hundred micrometers square. The divided small exposure areas are discontinuously exposed to the electron beams. Namely, one of the divided small exposure areas is exposed to the electron beam scanning which is different from the electron beam scannings for the other divided small exposure areas. The next exposure of the electron beam to the other divided small exposure area is carried out after a stage on which a substrate has been moved, for which reason boundaries between the divided small exposure areas have discontinuations in electron beam exposures due to error in accuracy of movement of the stage. Accordingly, the boundaries between the divided small exposure areas have discontinuations in the lattice patterns due to the error in accuracy of movement of the stage and strain of the pattern. This discontinuation of the lattice pattern is serious problem because it is extremely important for the lattice patterns that lattice points are regularly arranged. Therefore, the electron beam exposure is actually applicable to form the lattice pattern over a few hundreds micrometers squares. The optical exposure is responsible for forming the lattice pattern over a larger area of not less than about ten millimeters squares. The maximum area on which the lattice pattern may be formed by the electron beam exposure is only $1/1000$ to $1/100$ of the area on which the lattice pattern may be formed by the optical exposure.

The electron beam exposure is carried out by one-stroke irradiation of the electron beam, whilst the optical exposure is carried out by one-shot irradiation of the optical beam, for which reason the necessary time for the electron beam exposure is much longer than the necessary time for the optical exposure. The use of the electron beam exposure causes an extreme reduction in throughput of the semiconductor device having the fine lattice pattern, whereby the turn around time necessary for manufacturing the device is increased and also the manufacturing cost is also increased.

Further, the photo-resist for the electron beam exposure is lower in dry etching resistivity than the photo-resist for the optical exposure.

In the above circumstances, it had been required to develop a novel method of optical exposure to form a fine lattice pattern having a size-reduced lattice points, free from the above problem.

SUMMARY OF THE INVENTION

Accordingly, it is an object of the present invention to provide a novel method of optical exposure to form a fine lattice pattern having a size-reduced lattice points, free from the above problems.

It is a further object of the present invention to provide a novel method of method of optical exposure to form a fine lattice pattern with introduction of lattice defects into the lattice pattern.

The present invention provides a method of optical exposure to form a lattice pattern on a photo-resist, wherein at least two times of multiple exposure are carried out by use of different patterns.

The multiple exposures with the different patterns are carried out for forming a lattice pattern onto the photo-resist by utilizing the facts that the exposed part of the photo-resist has a high solubility to a development whilst the unexposed part of the photo-resist has an insolubility to a development. The multiple exposures are capable of higher exposure than the electron beam exposure. The multiple exposures are also capable of highest resolution limit of optical exposure method in forming the fine lattice pattern.

The above and other objects, features and advantages of the present invention will be apparent from the following descriptions.

BRIEF DESCRIPTION OF THE DRAWINGS

Preferred embodiments according to the present invention will be described in detail with reference to the accompanying drawings.

DISCLOSURE OF THE INVENTION

The present invention provides a method of optical exposure to form a lattice pattern on a photo-resist, wherein at least two times of multiple exposure are carried out by use of different patterns.

The multiple exposures with the different patterns are carried out for forming a lattice pattern onto the photo-resist by utilizing the facts that the exposed part of the photo-resist has a high solubility to a development whilst the unexposed part of the photo-resist has an insolubility to a development. The multiple exposures are capable of higher exposure than the electron beam exposure. The multiple exposures are also capable of highest resolution limit of optical exposure method in forming the fine lattice pattern.

The above different patterns used for the multiple exposures may comprise line-and-space patterns.

An exposure amount of each time of the multiple exposures may be not less than a critical exposure amount necessary for solution of the photo-resist into the development.

Alternatively, an exposure amount of each time of the multiple exposures may be less than a critical exposure amount necessary for solution of the photo-resist into the development provided that at least two times overlapped-exposed part has an exposure amount which is more than the critical exposure amount necessary for solution of the photo-resist into the development.

Two line-and-space patterns may be set to shift them to make an angle of 90 degrees for exposure to form a square-lattice pattern.

Two line-and-space patterns may be set to shift them to make an angle of 30 degrees for exposure to form a hexagon-lattice pattern.

Two line-and-space patterns may be set to shift them to make an angle of 60 degrees for exposure to form a hexagon-lattice pattern.

Line-and-space patterns having periodically divided space patterns may be set to shift them to make an angle of 30 degrees for exposure to form a honeycomb-lattice pattern.

Line-and-space patterns having periodically divided space patterns may be set to shift them to make an angle of 60 degrees for exposure to form a honeycomb-lattice pattern.

Line-and-space patterns having partially divided space patterns may be set for multiple exposure to form a lattice defect containing lattice pattern.

The above at least two times of multiple exposure may be carried out continuously without intervening any process.

The above at least two times of multiple exposure may be carried out discontinuously with intervening a development process.

Three line-and-space patterns may be set to shift them to make an angle of 30 degrees for said multiple exposure to form a honeycomb-lattice pattern.

PREFERRED EMBODIMENT

Figure 1:
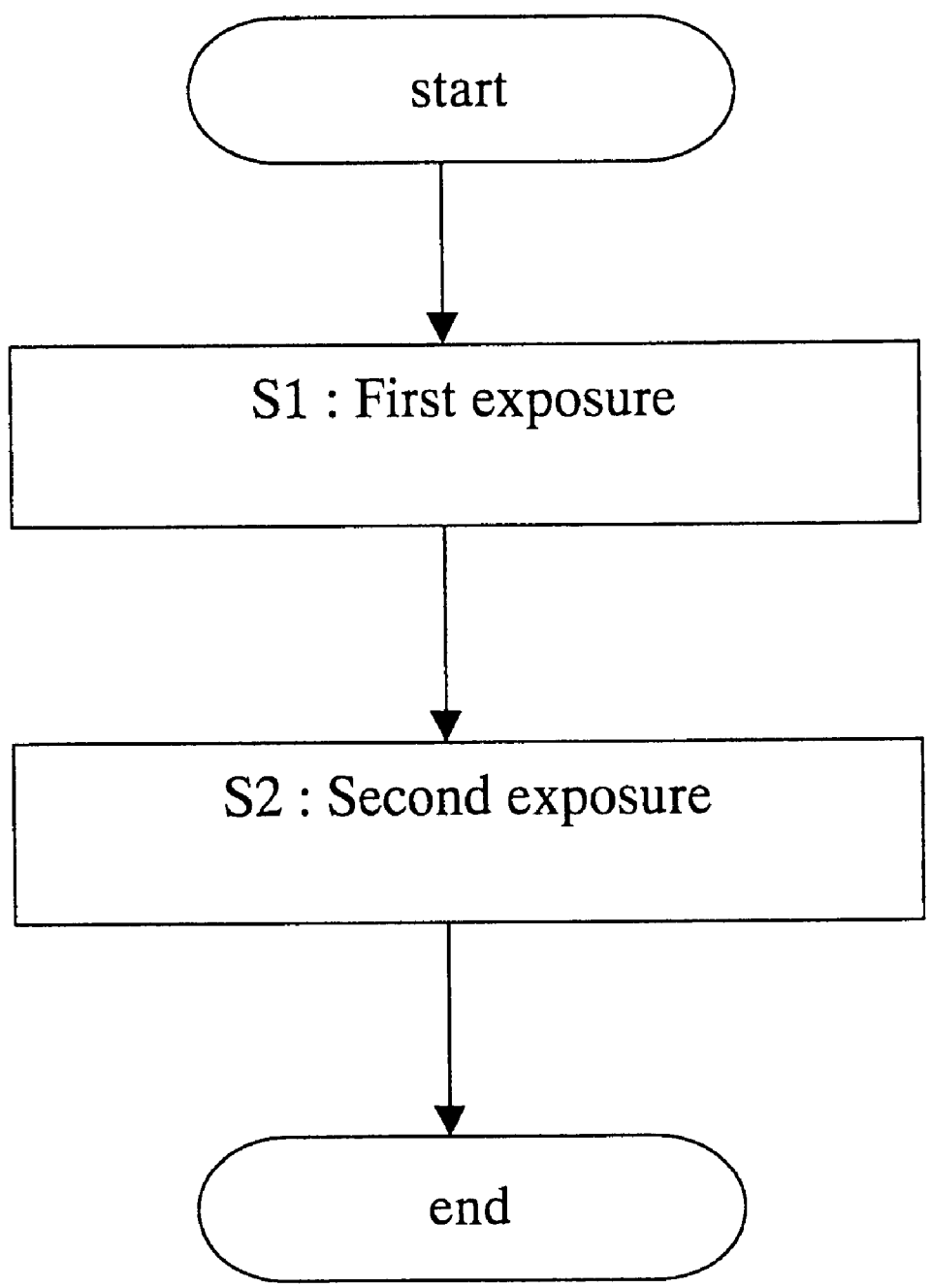
FIG. 1 is a flow chart illustrative of a novel method of multiple exposure to form a fine lattice pattern onto a photo-resist in a preferred embodiment in accordance with the present invention.
Figure 2:
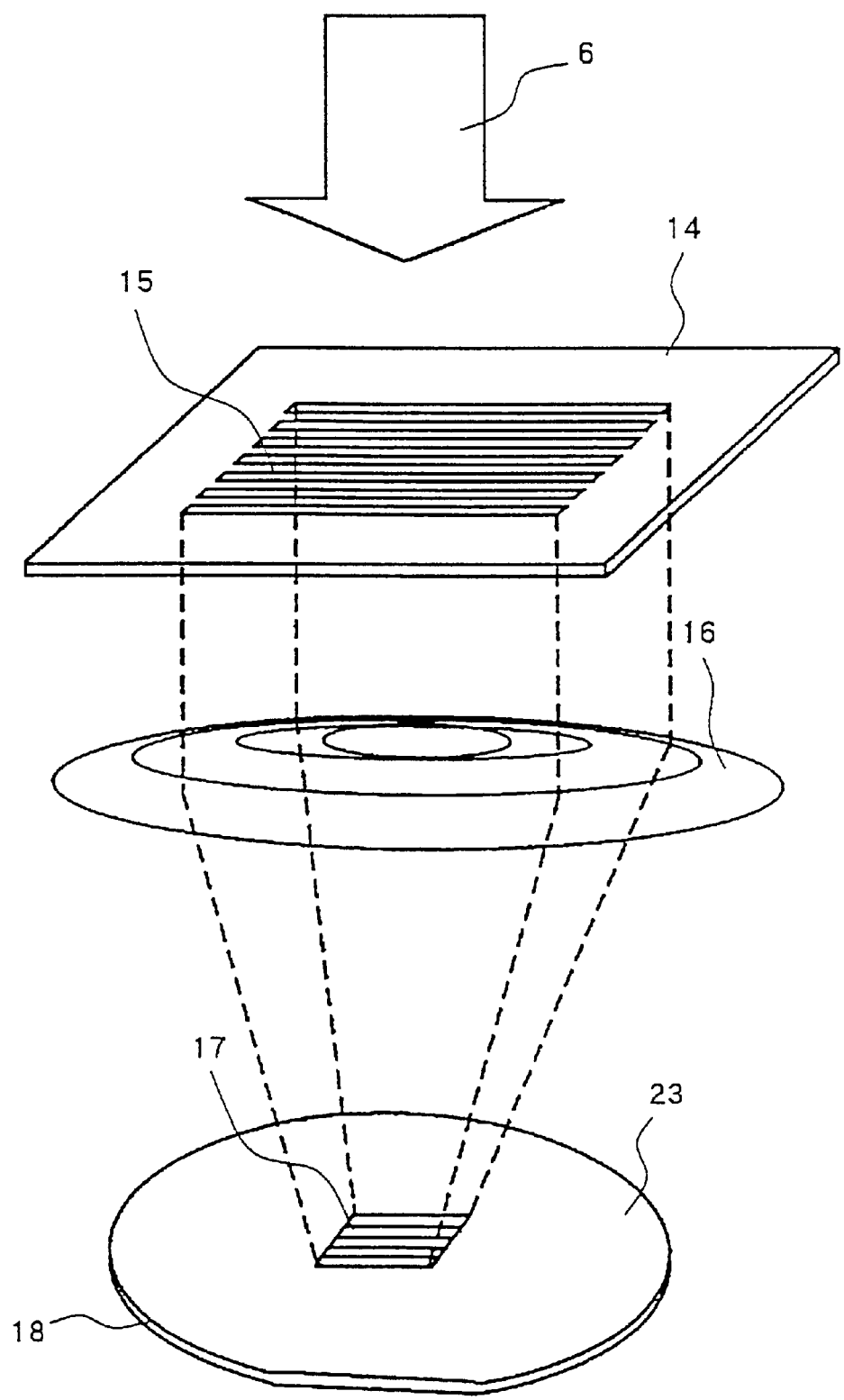
FIG. 2 is a schematic view illustrative of a part of an exposure system in a first step involved in the novel method of FIG. 1.
Figure 3:
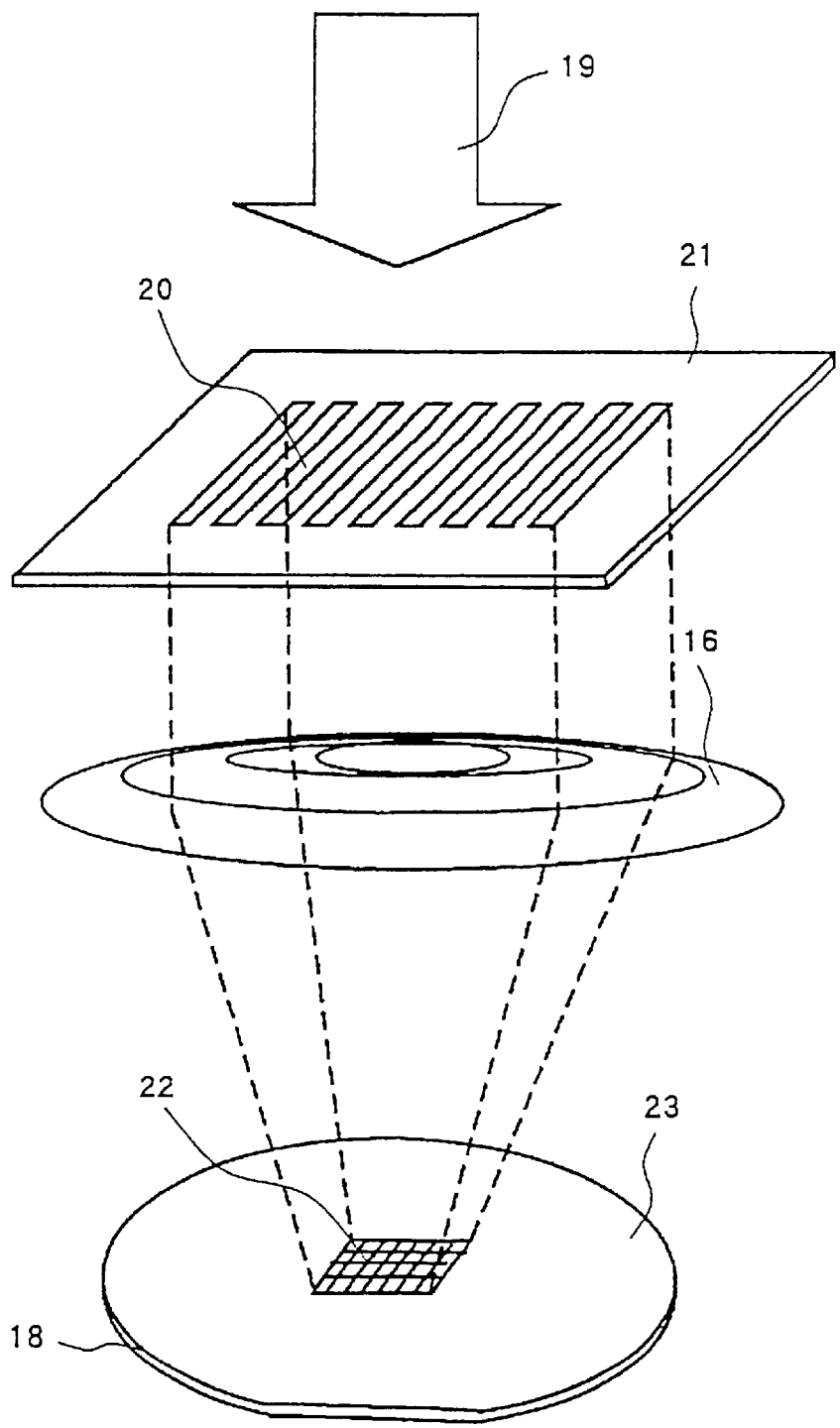
FIG. 3 is a schematic view illustrative of a part of an exposure system in a second step involved in the novel method of FIG. 1.

A first embodiment according to the present invention will be described in detail with reference to the drawings. FIG. 1 is a flow chart illustrative of a novel method of multiple exposure to form a fine lattice pattern onto a photo-resist. FIG. 2 is a schematic view illustrative of a part of an exposure system in a first step involved in the novel method of FIG. 1. FIG. 3 is a schematic view illustrative of a part of an exposure system in a second step involved in the novel method of FIG. 1.

A photo-resist 23 is formed on a substrate 18. The multiple exposure system has a first exposure mask 14 for a first exposure step, a second exposure mask 21 for a second exposure step, and a reducing optical lens 16. The first exposure mask 14 has a first line-and-space pattern 15. The second exposure mask 21 has a second line-and-space pattern 20.

In the first step S1, a first exposure light 6 is irradiated through the first exposure mask 14 having the first line-and-space pattern 15 and the reducing optical lens 16 onto a first exposing area 17 of the photo-resist 23. The first line-and-space pattern 15 is projected and transferred with scale reduction onto the photo-resist 23.

The second exposure mask 21 having the second line-and-space pattern 20 is so set that a first longitudinal direction of individual lines of the second line-and-space pattern 20 is different in angle from a second longitudinal direction of individual lines of the first line-and-space pattern 15.

In the second step S2, a second exposure light 19 is irradiated through the second exposure mask 21 having the second line-and-space pattern 20 and the reducing optical lens 16 onto a second exposing area 22 which is overlapped with the first exposing area 17. The second line-and-space pattern 20 is projected and transferred with scale reduction onto the photo-resist 23, whereby a dual exposure is completed.

Figure 4:
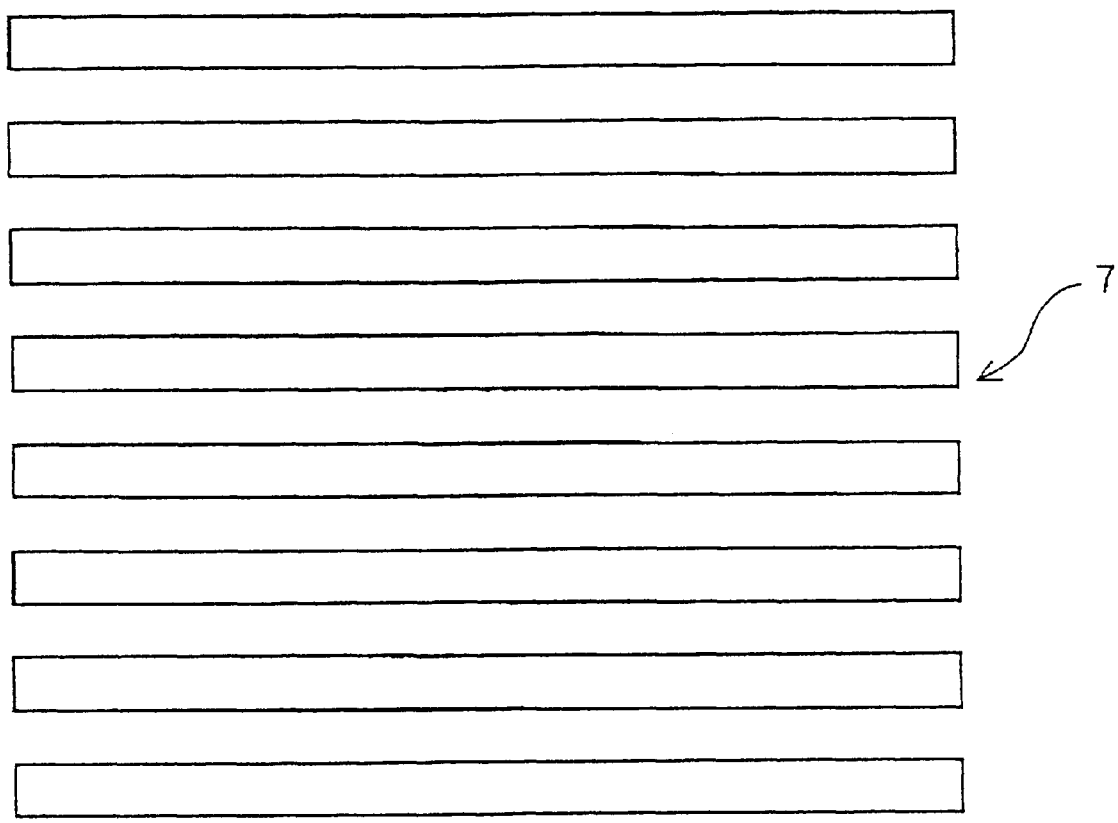
FIG. 4 is a diagram illustrative of a first exposure pattern formed on the photo-resist by the first exposure process of the novel multiple exposure method in a preferred embodiment in accordance with the present invention.

FIG. 4 is a diagram illustrative of a first exposure pattern formed on the photo-resist by the first exposure process of the novel multiple exposure method. A first exposure pattern 7 is formed on the photo-resist 23 by the first exposure process, wherein the longitudinal direction of the lines is defined to be the first direction.

Figure 5:
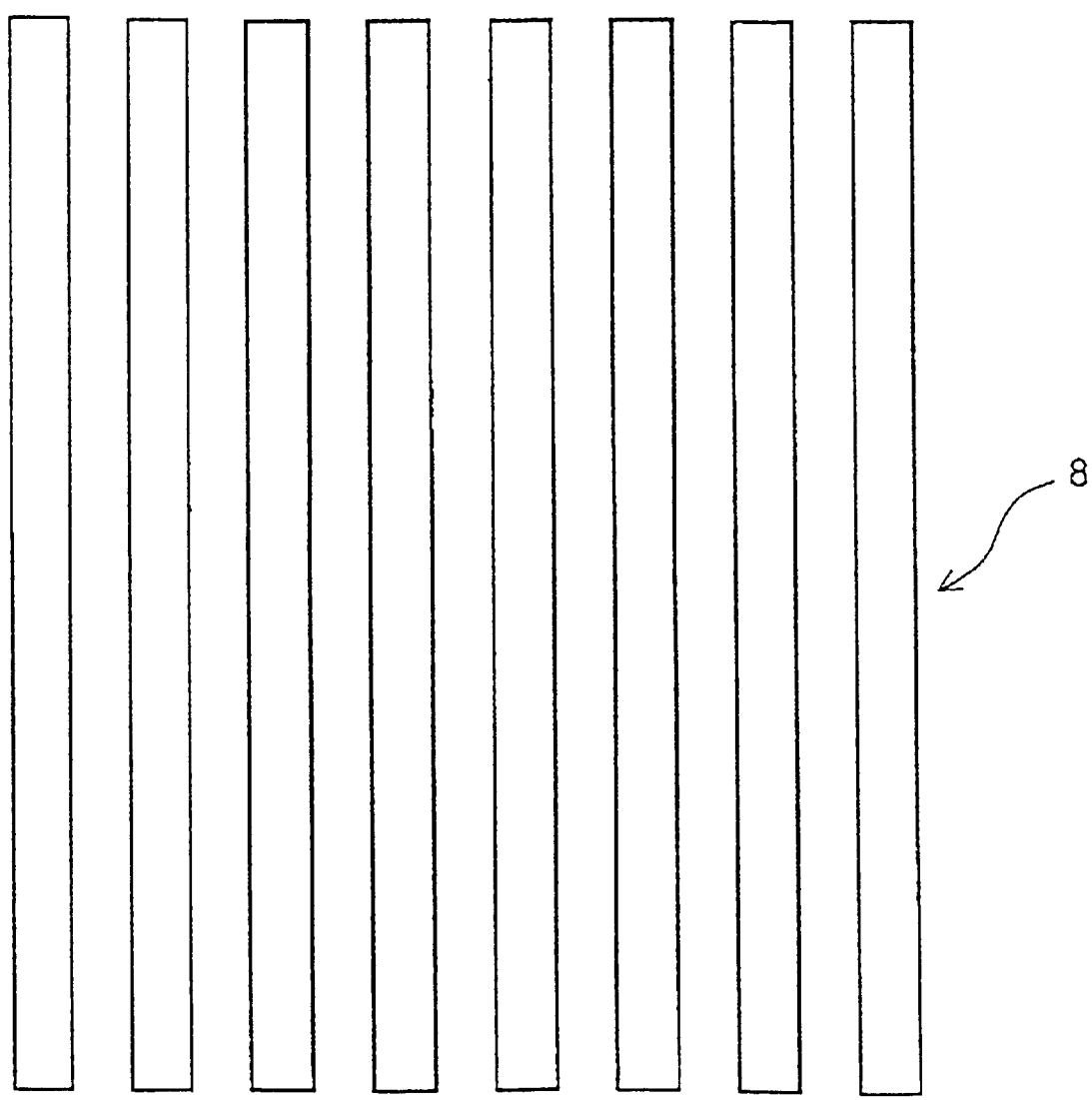
FIG. 5 is a diagram illustrative of a second exposure pattern formed on the photo-resist by the first exposure process of the novel multiple exposure method in a preferred embodiment in accordance with the present invention.

FIG. 5 is a diagram illustrative of a second exposure pattern formed on the photo-resist by the first exposure process of the novel multiple exposure method. A second exposure pattern 8 is formed on the photo-resist 23 by the second exposure process, wherein the longitudinal direction of the lines is defined to be the second direction which is perpendicular to the first direction.

Figure 6:
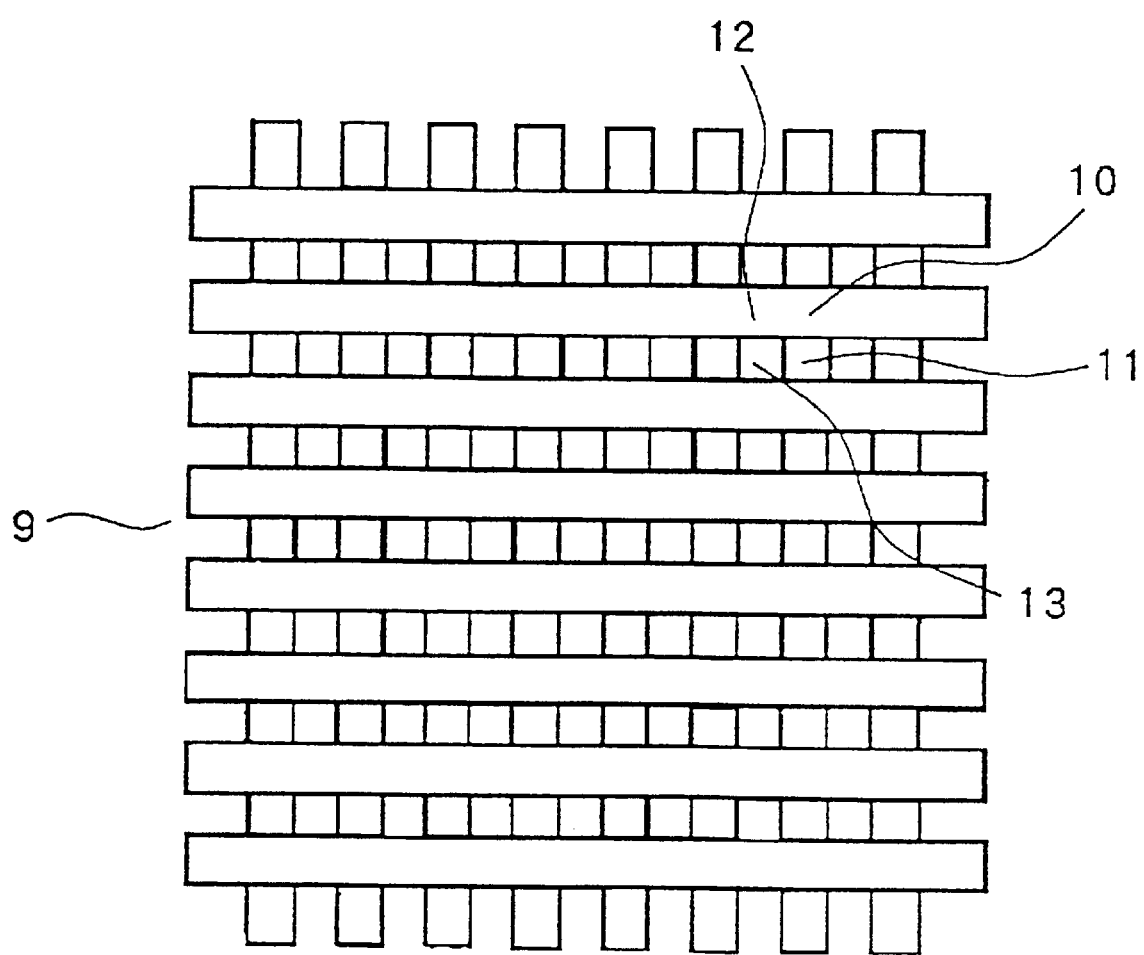
FIG. 6 is a diagram illustrative of a final exposure pattern finally formed by the first and second exposure processes on the photo-resist, wherein the final exposure pattern is the overlapped patterns of the first and second exposure patterns of FIGS. 4 and 5.

FIG. 6 is a diagram illustrative of a final exposure pattern finally formed by the first and second exposure processes on the photo-resist, wherein the final exposure pattern is the overlapped patterns of the first and second exposure patterns of FIGS. 4 and 5. A final exposure pattern 9 is formed on the photo-resist 23 by the dual exposure processes, wherein the second exposure pattern 8 overlaps the first exposure pattern 7.

The final exposure pattern 9 finally obtained through the first and second exposures comprises dual-exposed parts 10 having received the first and second exposures, first-exposed parts 11 having received only the first exposure, second-exposed parts 12 having received only the second exposure, and unexposed parts 13 having never received either the first or second exposures. The first exposure light 6 has a first light quantity E1. The second exposure light 19 has a second light quantity E2. The dual-exposed parts 10 have a total exposed-light quantity of E1+E2. The first-exposed parts 11 have a total exposed-light quantity of E1. The second-exposed parts 12 have a total exposed-light quantity of E2. The unexposed parts 13 have a total exposed-light quantity of zero.

Figure 7:
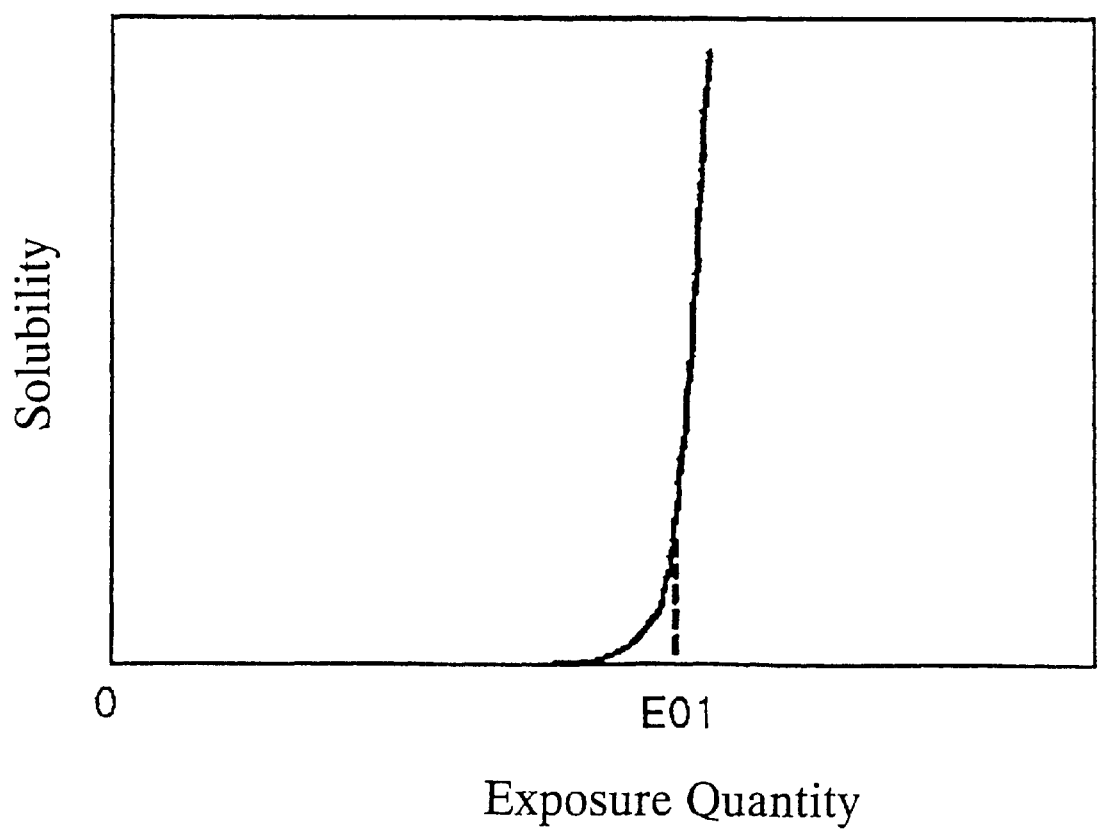
FIG. 7 is a diagram illustrative of variation in solubility of a positive type photo-resist to a development over exposing light quantity.
Figure 8A:
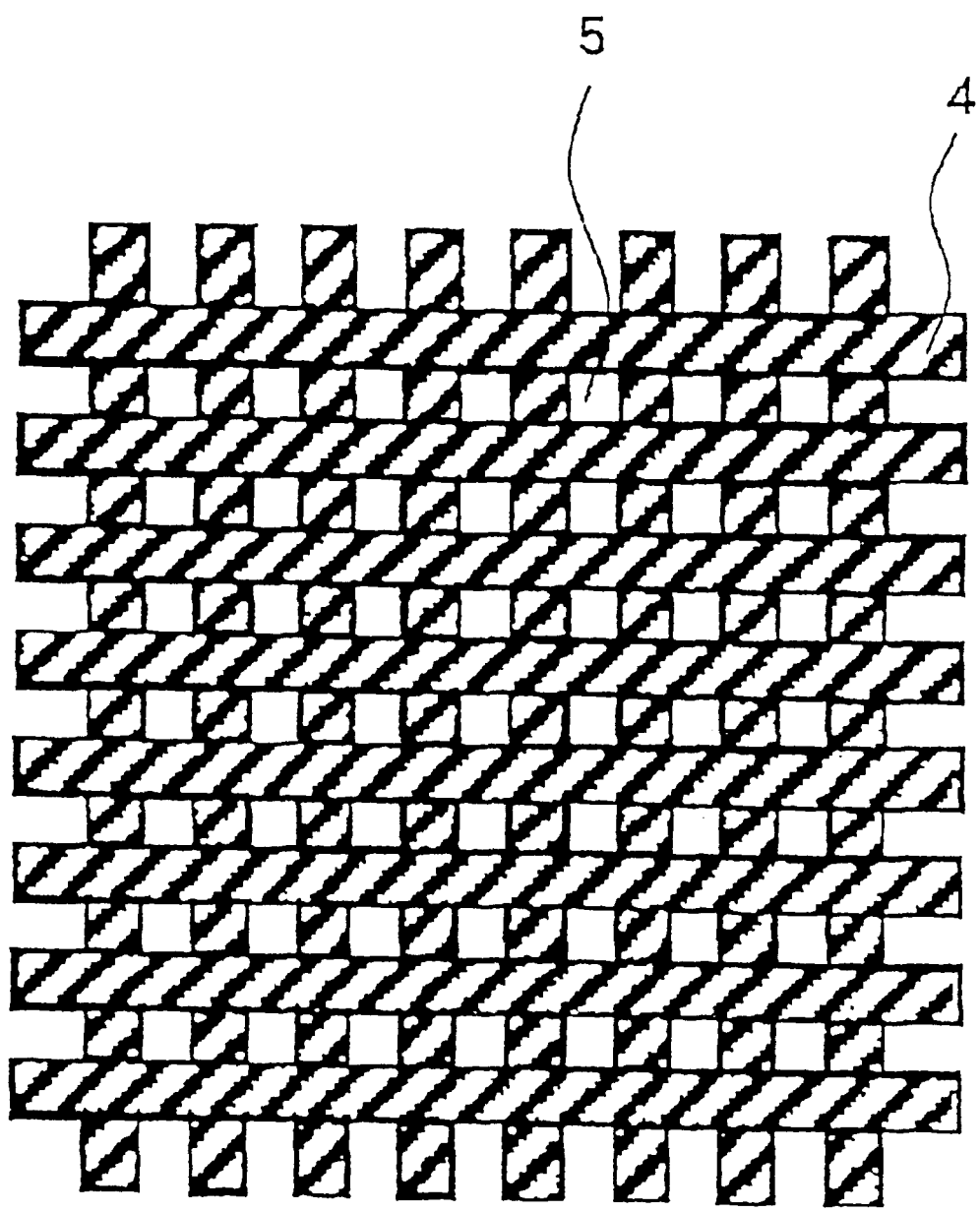
FIG. 8A is diagram illustrative of sensitized and unsensitized patterns of the photo-resist If the first and second exposure light quantities E1 and E2 are greater than the critical exposure light quantity E01 necessary for solution of the exposed parts of the photo-resist into the development.

FIG. 7 is a diagram illustrative of variation in solubility of a positive type photo-resist to a development over exposing light quantity. The solubility of a positive type photo-resist is non-linear versus the exposing light quantity. E01 represents a critical amount of exposure light necessary for solution of the exposed parts of the photo-resist into the development. If the first and second exposure light quantities E1 and E2 are greater than the critical exposure light quantity E01, then the dual-exposed parts 10, the first-exposed parts 11 and the second-exposed parts 12 receive sufficient quantities of exposures over the critical exposure light quantity E01. FIG. 8A is diagram illustrative of sensitized and unsensitized patterns of the photo-resist If the first and second exposure light quantities E1 and E2 are greater than the critical exposure light quantity E01 necessary for solution of the exposed parts of the photo-resist into the development. Crosshatched regions are sensitized portions 4 which are soluble into the development. Uncrosshatched regions are unsensitized portions 5 which are insoluble into the development. After the development to the photo-resist was made, the unsensitized portions 5 remain to form square-shaped lattice patterns.

Figure 8B:
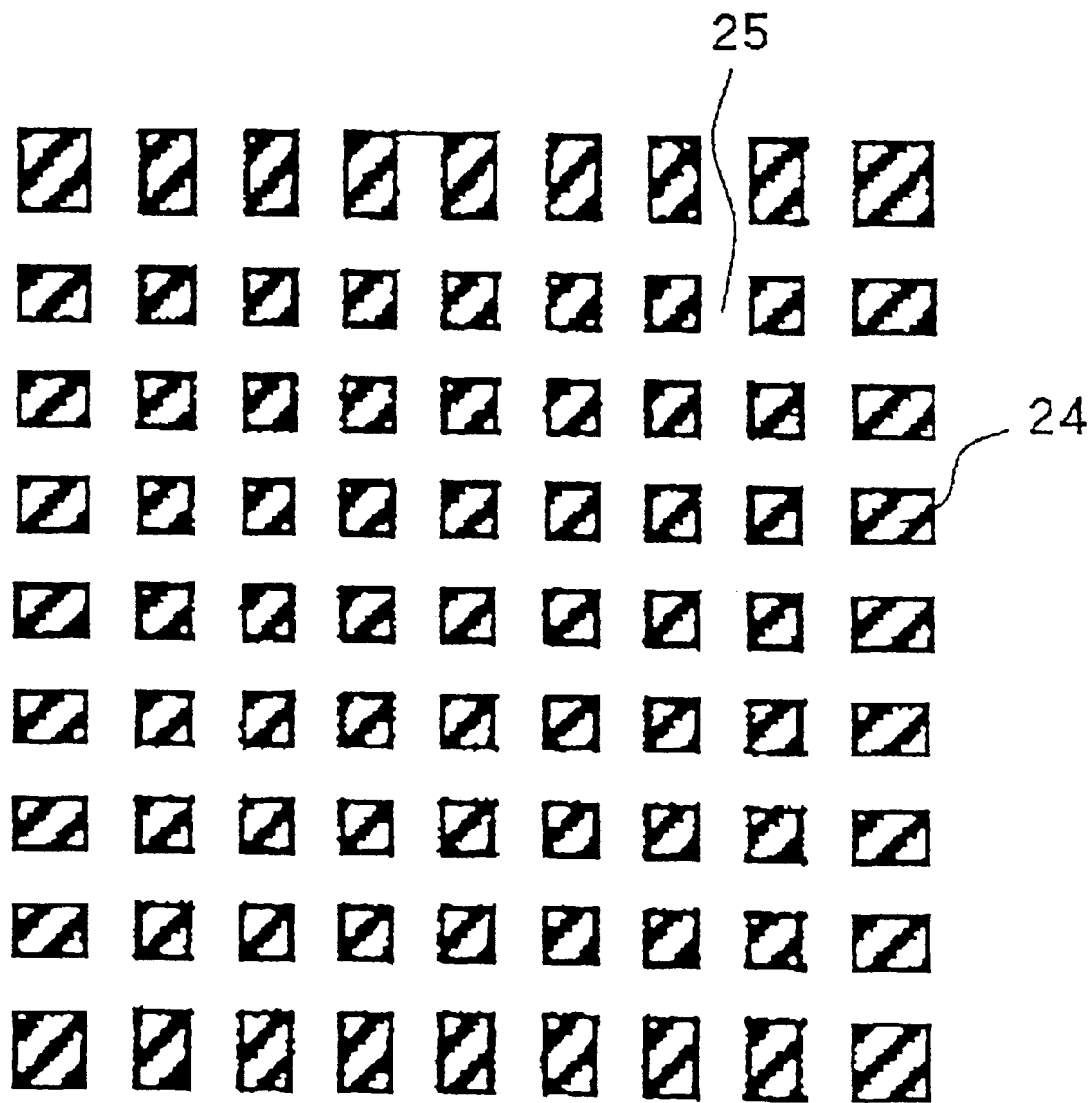
FIG. 8B is diagram illustrative of sensitized and unsensitized patterns of the photo-resist If the first and second exposure light quantities E1 and E2 are greater than the critical exposure light quantity E01 necessary for solution of the exposed parts of the photo-resist into the development.
Figure 9:
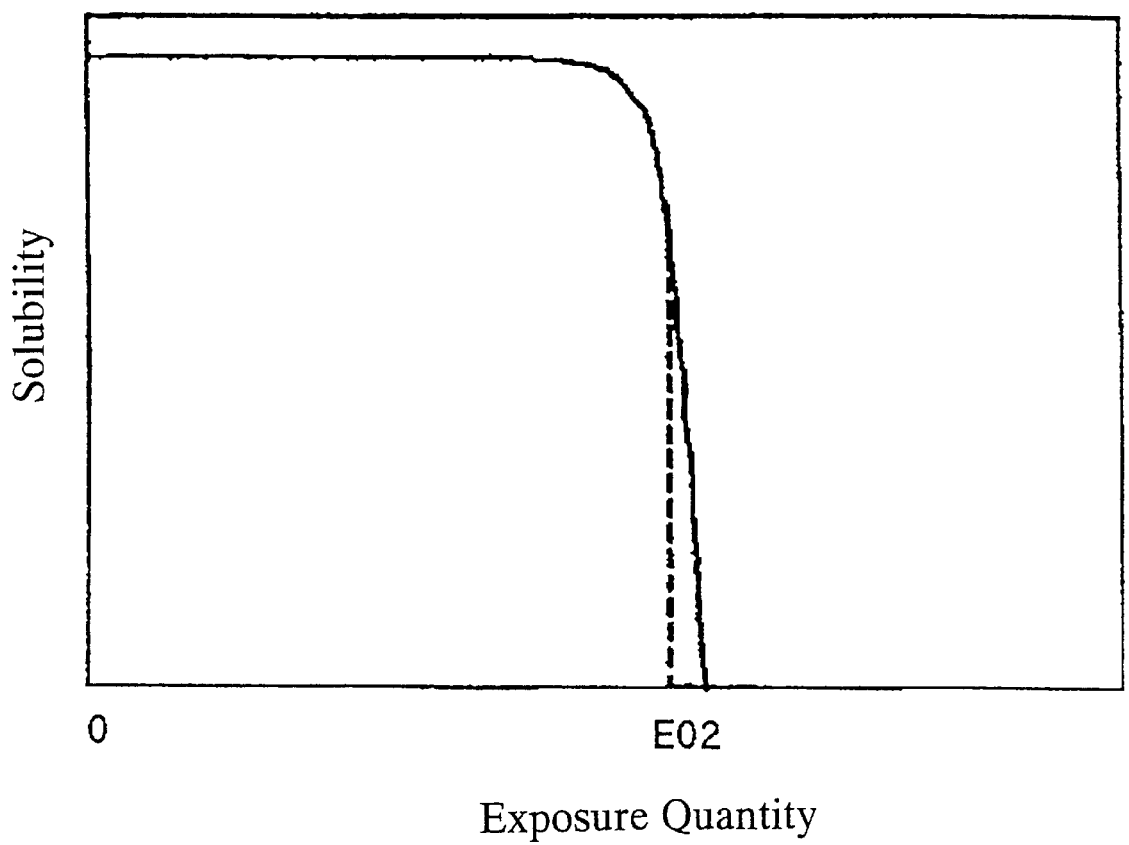
FIG. 9 is a diagram illustrative of variation in solubility of a negative type photo-resist to a development over exposing light quantity.
Figure 10:
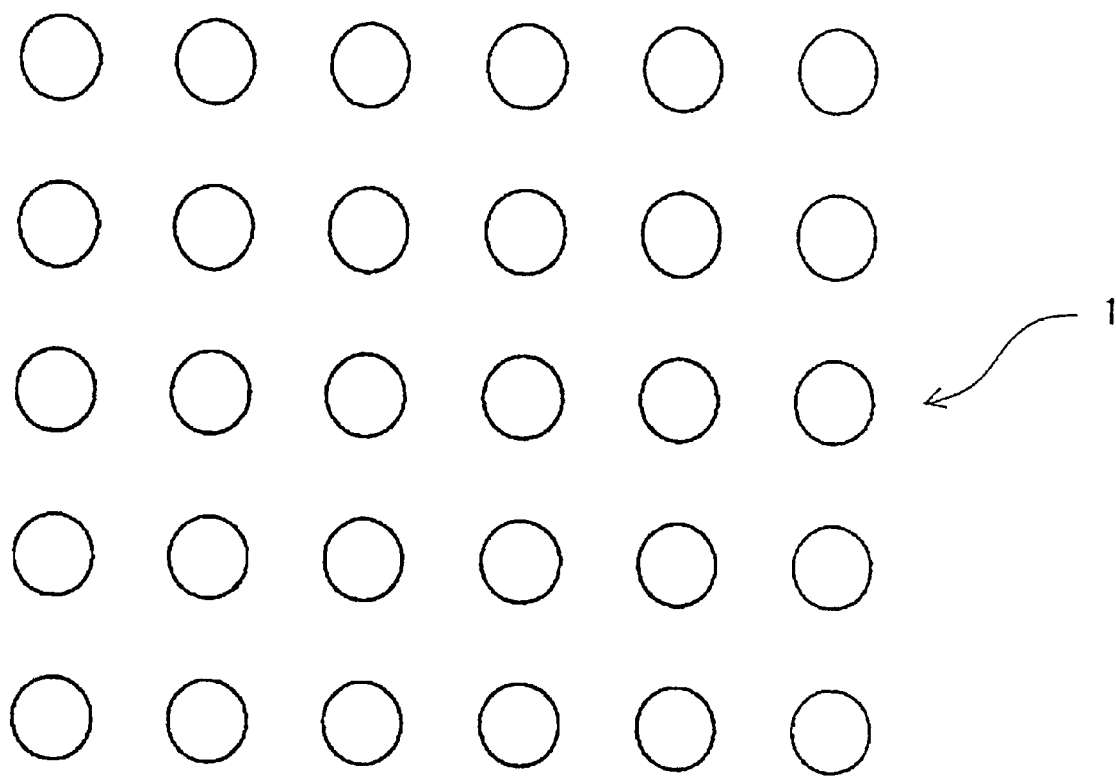
FIG. 10 is a diagram illustrative of a fine tetragonal lattice of circles.
Figure 11:
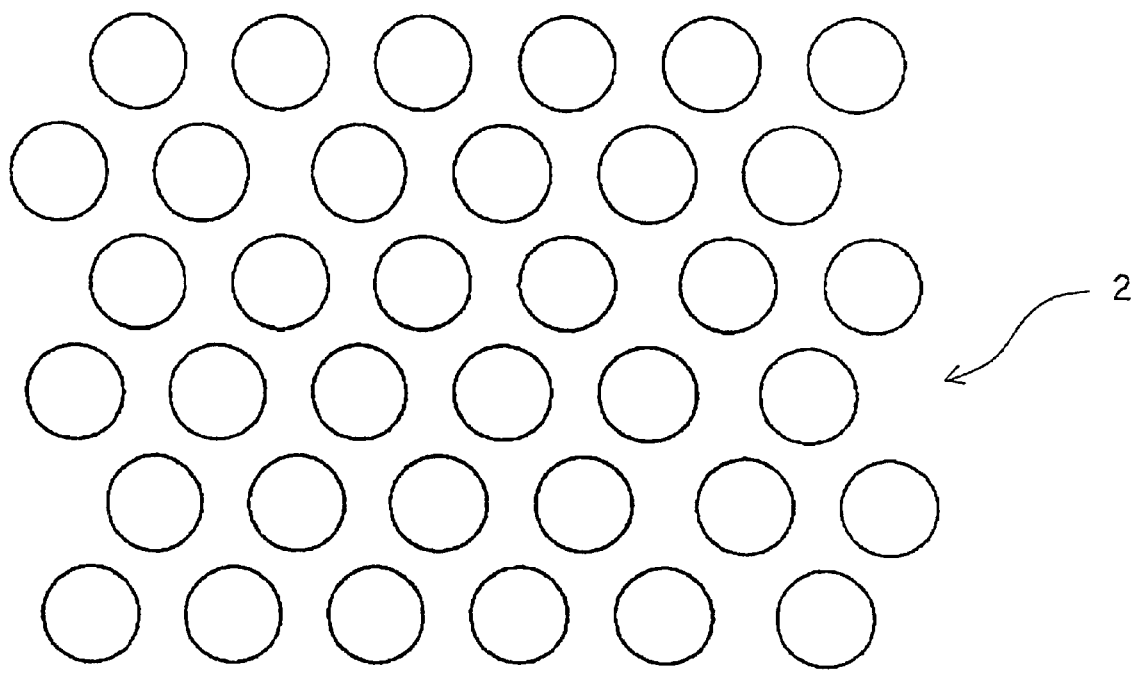
FIG. 11 is a diagram illustrative of a fine hexagonal lattice of circles.
Figure 12:
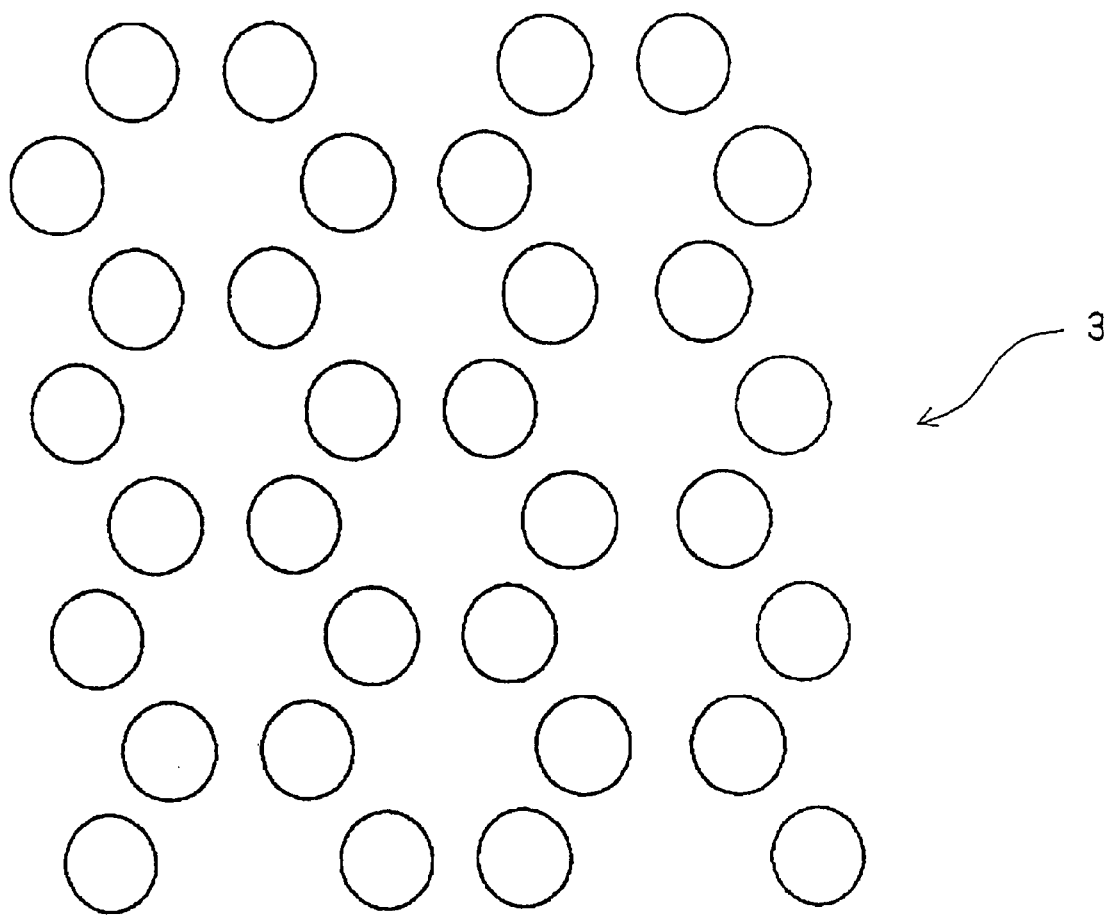
FIG. 12 is a diagram illustrative of a fine honeycomb-structured lattice of circles.

FIG. 9 is a diagram illustrative of variation in solubility of a negative type photo-resist to a development over exposing light quantity. The solubility of a negative type photo-resist is non-linear versus the exposing light quantity. E02 represents a critical amount of exposure light necessary for solution of the exposed parts of the negative type photo-resist into the development. If the first and second exposure light quantities E1 and E2 are greater than the critical exposure light quantity E02, then the dual-exposed parts 10, the first-exposed parts 11 and the second-exposed parts 12 receive sufficient quantities of exposures over the critical exposure light quantity E02. FIG. 8B is diagram illustrative of sensitized and unsensitized patterns of the photo-resist If the first and second exposure light quantities E1 and E2 are greater than the critical exposure light quantity E01 necessary for solution of the exposed parts of the photo-resist into the development. Crosshatched regions are unsensitized portions 24 which are insoluble into the development. Uncrosshatched regions are sensitized portions 25 which are soluble into the development. After the development to the photo-resist was made, the unsensitized portions 24 remain to form square-shaped lattice patterns.

The photo-resist 23 is the positive type photo-resist. The total amount of the first and second exposure light quantities E1 and E2 is greater than the critical exposure light quantity E01 necessary for solution of the exposed parts of the photo-resist into the development, but individuals of the first and second exposure light quantities E1 and E2 are lower than the critical exposure light quantity E01. In this case, only the dual exposed parts 10 are sensitized to be made soluble into the development. The first-exposed parts 11, the second-exposed parts 12 and the unexposed parts 13 are unsensitized and remain insoluble into the development. After the development is made to the photo-resist, only the dual exposed parts 10 are removed whilst the first-exposed parts 11, the second-exposed parts 12 and the unexposed parts 13 remain to form the lattice pattern.

The photo-resist 23 is the negative type photo-resist. The total amount of the first and second exposure light quantities E1 and E2 is greater than the critical exposure light quantity E01 necessary for solution of the exposed parts of the photo-resist into the development, but individuals of the first and second exposure light quantities E1 and E2 are lower than the critical exposure light quantity E01. In this case, only the dual exposed parts 10 are sensitized to be made insoluble into the development. The first-exposed parts 11, the second-exposed parts 12 and the unexposed parts 13 are unsensitized and remain soluble into the development. After the development is made to the photo-resist, the first-exposed parts 11, the second-exposed parts 12 and the unexposed parts 13 are removed whilst only the dual exposed parts 10 remain to form the lattice pattern.

The above descriptions may be applicable to either when the first and second exposure light quantities E1 and E2 are the same as each other or different from each other.

Figure 13:
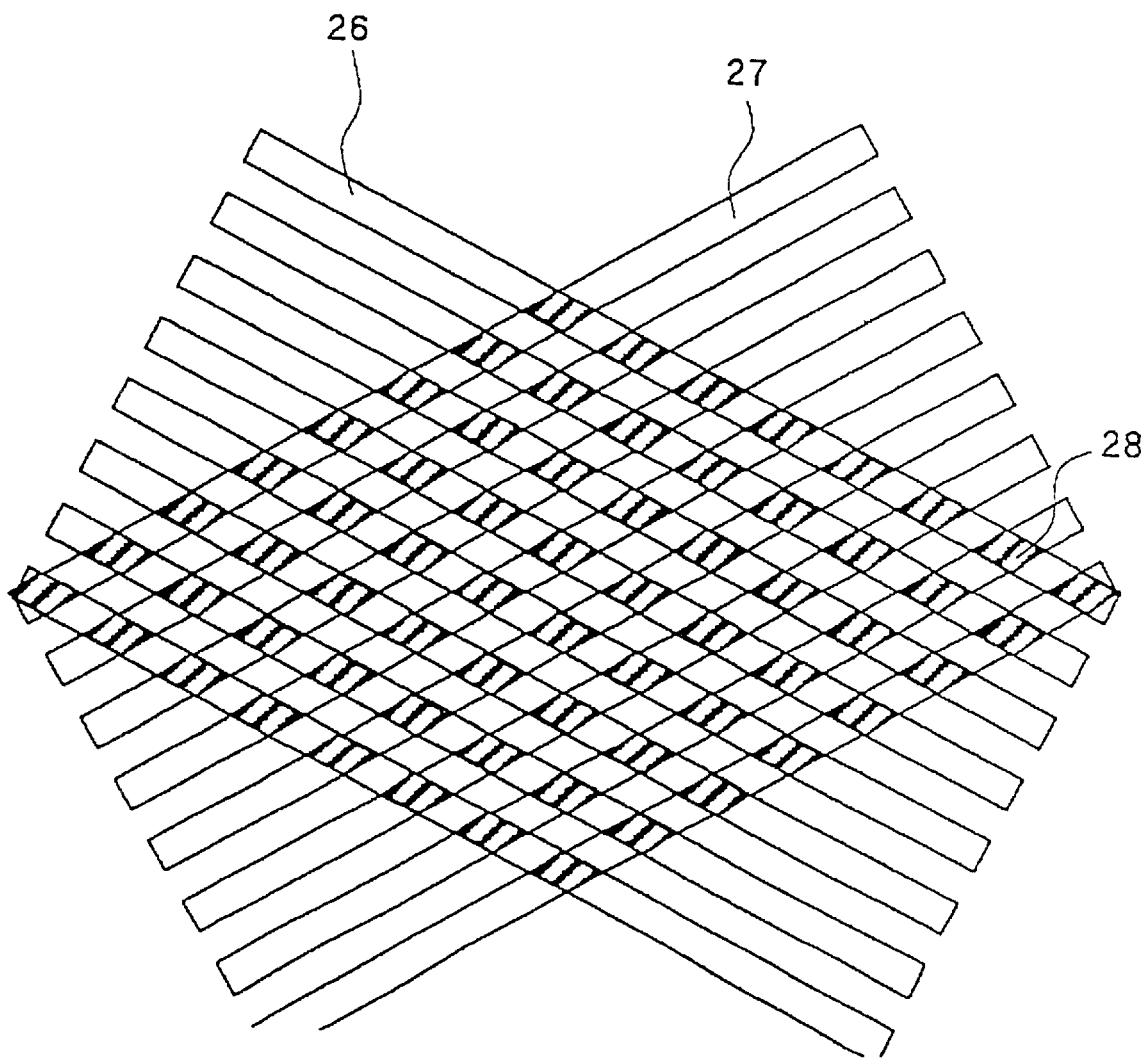
FIG. 13 is a diagram illustrative of first and second line-and-space exposure patterns which has an angle of 60 degrees defined between a first direction along which lines of the first line-and-space pattern extend and a second direction along which lines of the second line-and-space pattern extend.

In the above description, the first and second exposure masks are set to make the right angle of 90 degrees between the first direction along which the lines of the first line-and-space pattern 15 extend and the second direction along which the lines of the second line-and-space pattern 20. It is, however, possible to modify the angle defined between the first direction along which the lines of the first line-and-space pattern 15 extend and the second direction along which the lines of the second line-and-space pattern 20 extend. If the angle is 60 degrees and the positive type photo-resist is used, where E1+E2 is greater than E01 and E01 is greater than E1 and E2, then a hexagonal lattice of hexagon-lattice points is formed. FIG. 13 is a diagram illustrative of first and second line-and-space exposure patterns which has an angle of 60 degrees defined between a first direction along which lines of the first line-and-space pattern extend and a second direction along which lines of the second line-and-space pattern extend. Hexagonal shaped lattice points 28 are defined by overlapping the first line-and-space exposure patterns 26 and the second line-and-space exposure patterns 27.

Figure 14:
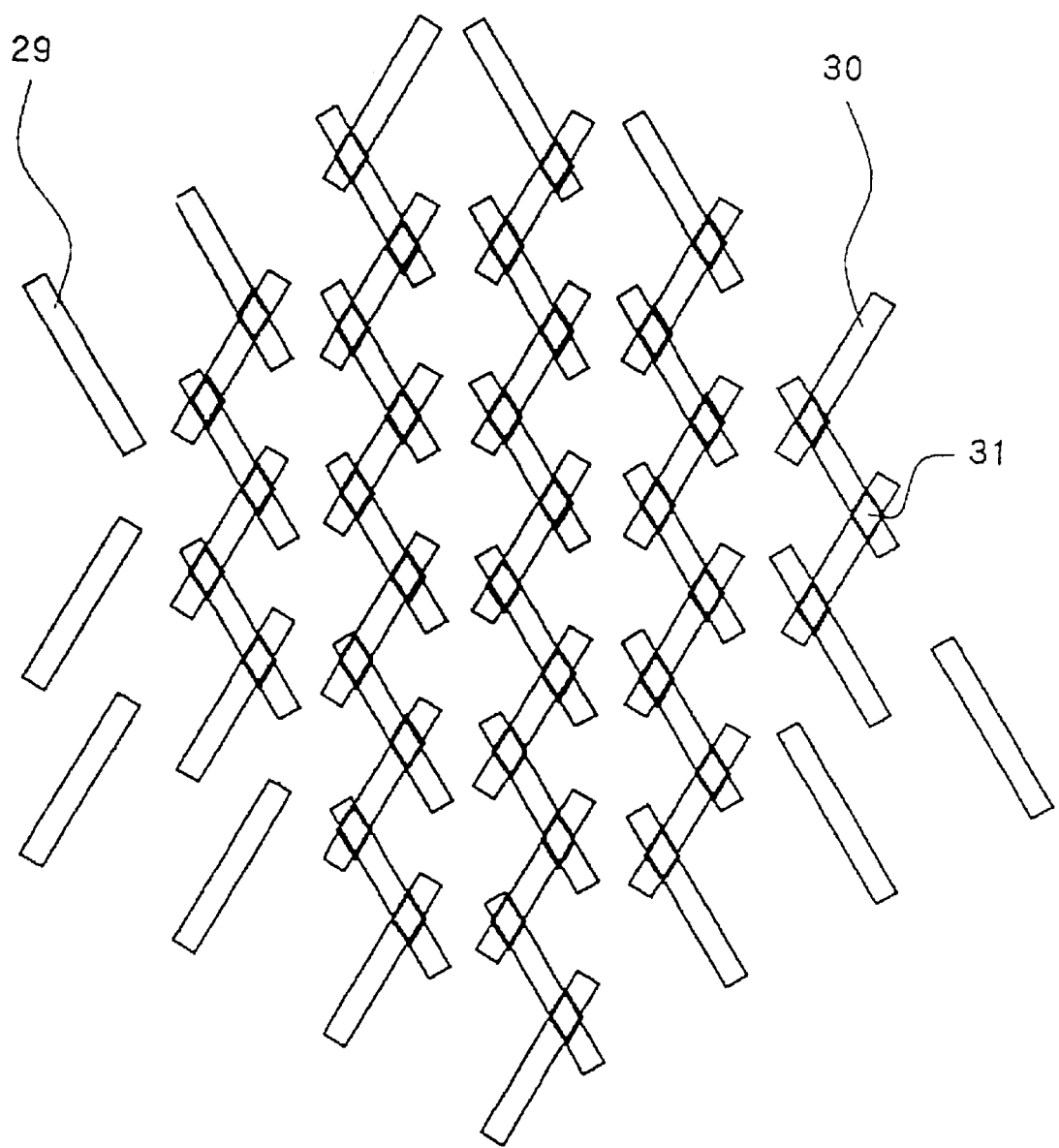
FIG. 14 is a diagram illustrative of first and second line-and-space exposure patterns which has an angle of 30 degrees defined between a first direction along which lines of the first line-and-space pattern extend and a second direction along which lines of the second line-and-space pattern extend.

It is further possible to modify the angle defined between the first direction along which the lines of the first line-and-space pattern 15 extend and the second direction along which the lines of the second line-and-space pattern 20 extend. If the angle is 30 degrees and the positive type photo-resist is used, where E1+E2 is greater than E01 and E01 is greater than E1 and E2, then a honeycomb lattice of diamond-lattice points is formed. FIG. 14 is a diagram illustrative of first and second line-and-space exposure patterns which has an angle of 30 degrees defined between a first direction along which lines of the first line-and-space pattern extend and a second direction along which lines of the second line-and-space pattern extend. Diamond shaped lattice points 31 of the honeycomb lattice are defined by overlapping the first line-and-space exposure patterns 29 and the second line-and-space exposure patterns 30.

As a further modification to the exposure amounts, it is possible that the first exposure quantity E1 is greater than the critical exposure light quantity E01 and the second exposure quantity E2 is also greater than the critical exposure light quantity E01, provided that the positive photo-resist is used.

As a further more modification to the type of the photo-resist, the negative photo-resist may be used, provided that the critical exposure light quantity is E02 which is necessary for sensitizing the exposed parts of the photo-resist.

Figure 17:
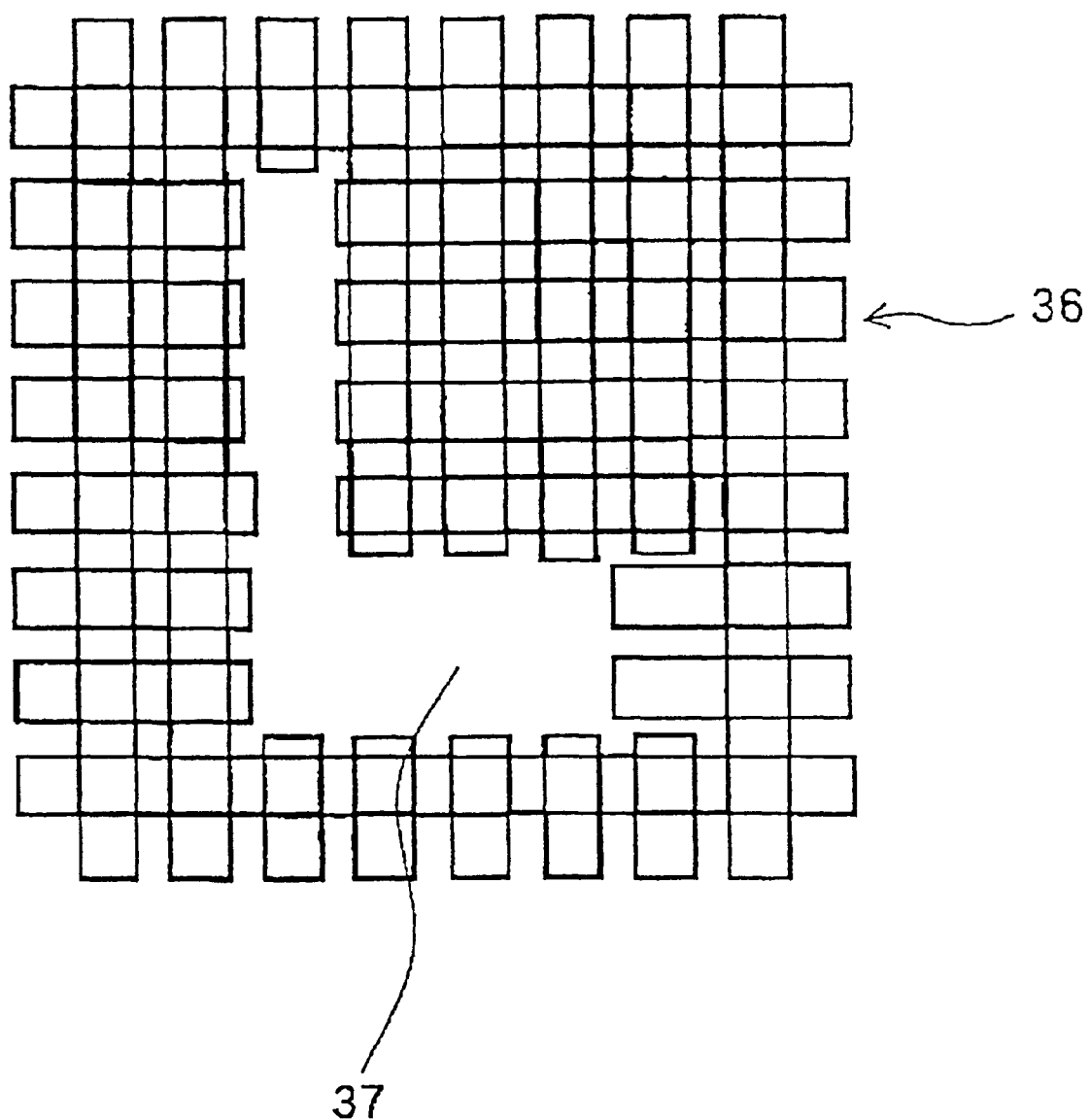
FIG. 17 is a plane view illustrative of overlapped two line-and-space patterns used in order to introduce an L-shaped lattice defect.

It is possible to consider that the honeycomb lattice pattern corresponds to a pattern obtained by partially eliminating hexagonal lattice points from the hexagonal lattice pattern. Namely, the honeycomb lattice pattern is obtained by introducing lattice defects into the hexagonal lattice pattern. The multiple exposure method of forming the honeycomb lattice pattern also provides a method of introducing lattice defects into the hexagonal lattice pattern. Lines or spaces of the line-and-space pattern are divided by defecting portions which are positioned corresponding to the lattice defects. It is possible to introduce the lattice defects at optional positions or sites. If one lattice point is defected, this lattice defect is so called to as point defect. If an alignment of lattice points is defected, then this lattice defect is so called to as line defect. If an array of lattice points is defected, then this lattice defect is so called to as area defect. FIG. 17 is a plane view illustrative of overlapped two line-and-space patterns used in order to introduce an L-shaped lattice defect. Two line-and-space patterns 36 are used in order to introduce an L-shaped lattice defect 37. The line is divided by the space-part, whilst the space is divided by a line-part.

Figure 15A:
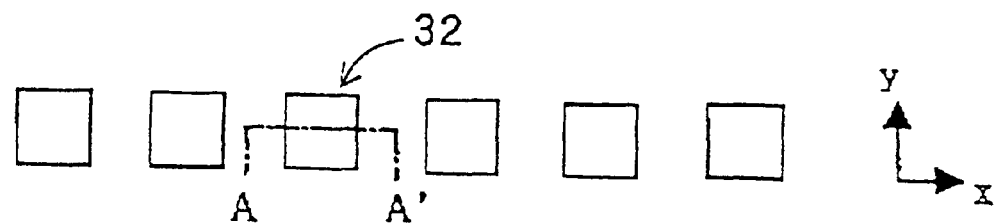
FIG. 15A is a diagram illustrative of a periodic square pattern of periodically arranged square lattice points of 0.35 micrometers square at 0.7 micrometers pitch.
Figure 15B:
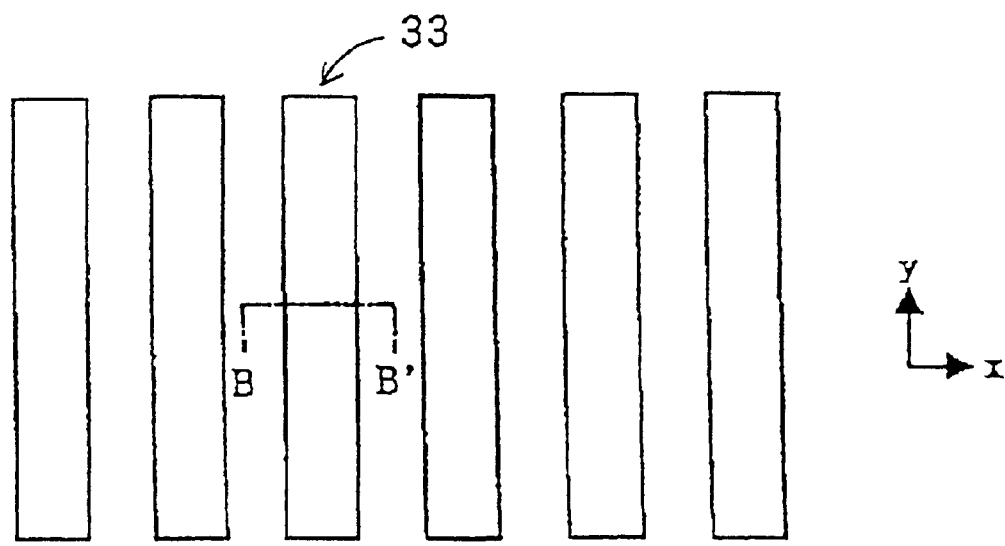
FIG. 15B is a diagram illustrative of a line-and-space pattern of lines of 0.35 micrometers in width which are aligned at a pitch of 0.7 micrometers.
Figure 16:
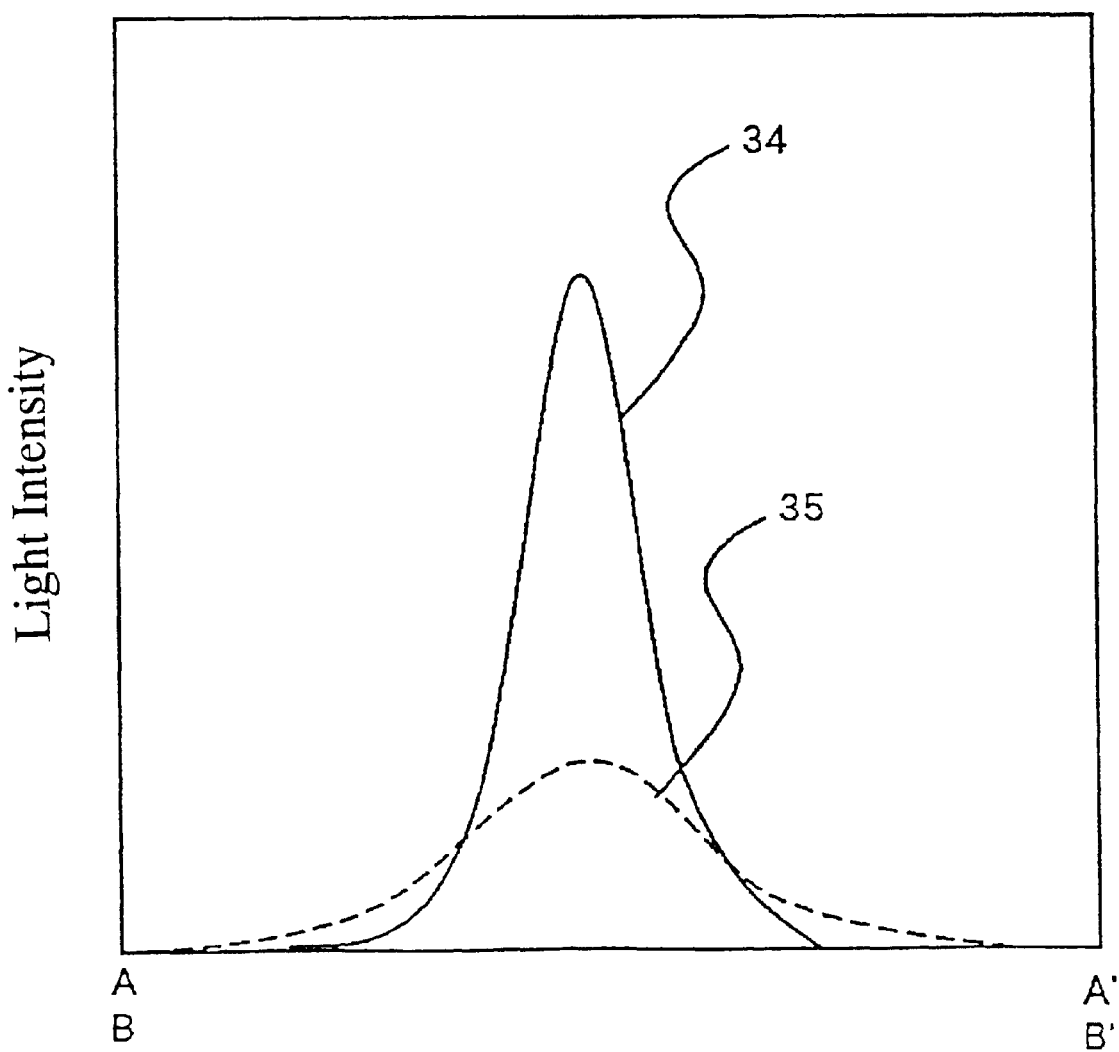
FIG. 16 is a diagram illustrative of light intensity profiles of the periodic square pattern of FIG. 15A taken along an A–A' line and of the line-and-space pattern of FIG. 15B taken along a B–B' line.

The dual exposure described above provides the following advantages. It is possible to use the line-and-space patterns in place of the lattice pattern. The use of line-and-space patterns makes it possible to form more fine lattice patterns rather than when a lattice pattern is transferred by one time onto the photo-resist. FIG. 15A is a diagram illustrative of a periodic square pattern 32 of periodically arranged square lattice points of 0.35 micrometers square at 0.7 micrometers pitch. FIG. 15B is a diagram illustrative of a line-and-space pattern 33 of lines of 0.35 micrometers in width which are aligned at a pitch of 0.7 micrometers. FIG. 16 is a diagram illustrative of light intensity profiles of the periodic square pattern 32 of FIG. 15A taken along an A–A' line and of the line-and-space pattern 33 of FIG. 15B taken along a B–B' line, wherein the real line represents a line-and-space pattern light intensity profile 34 and the broken line represents a periodic square pattern light intensity profile 35. A peak level of the periodic square pattern light intensity profile 35 is only about one third of a peak level of the line-and-space pattern light intensity profile 34. A base width of the periodic square pattern light intensity profile 35 is wider than a base width of the line-and-space pattern light intensity profile 34. The periodic square pattern light intensity profile 35 means that the use of the periodic square pattern 32 results in low contrast in light intensity. The line-and-space pattern light intensity profile 34 means that the use of the periodic square pattern 32 results in high contrast in light intensity. This difference in contrast between the periodic square pattern 32 and the periodic square pattern 32 is caused by a difference in shape of the pattern. As the pattern size is reduced as closely to the wavelength of the exposing light, then a light diffraction is made remarkable whereby the contrast in the intensity of the exposure light through the exposure mask is low. If the line-and-space pattern 33 is used, the minimum size effect is caused but only in the line width direction. If the periodic square pattern 32 is used, the minimum size effect is caused both directions. Namely, if the line-and-space pattern 33 is used, the contrast is reduced by 1/k, where k is greater than 1. If the periodic square pattern 32 is used, the contrast is reduced by 1/k×k. If the periodic square pattern 32 is used, the minimum size for resolution is made larger than the wavelength. If the line-and-space pattern 33 is used for multiple exposures, the minimum size for resolution is suppressed at the wavelength. If i-ray is used together with the line-and-space pattern 33 for multiple exposures, then it is possible to form a fine lattice pattern of about 0.35 micrometers in lattice point size. This means that the above novel multiple exposure method using the plural line-and-space patterns is capable of forming the lattice patterns required for forming the two-dimensional periodic structured photonic crystal. If i-ray is used together with the line-and-space pattern 33 for multiple exposures, then "k" is about 2, 1/k is about 0.5. If i-ray is used together with the periodic square pattern 32 for one-shot exposure, then "k" is about 2, 1/k×k is about 0.25. This means that the above novel multiple exposure method using the plural line-and-space patterns is capable of using the i-ray stepper to form the fine lattice patter onto a larger area of the photo-resist at high speed, even the electron beam exposure is incapable. The above novel multiple exposure method provides a great improvement in productivity. Further, the above novel multiple exposure method provides an advantage in use of the optical exposure photo-resist mask which is superior in dry etching resistivity than the electron beam exposure photo-resist mask.

The above novel multiple exposure method may be applicable along with a phase shift mask for obtaining a high resolution beyond wavelength limitation in order to obtain more fine lattice pattern. If i-ray is used together with the phase shift mask in the above novel multiple exposure method, the minimum lattice point size is 0.25 micrometers square and the minimum periodic pitch is 0.5 micrometers. It is possible to form a photonic crystal having a fine lattice pattern responsible for a light of 1 micrometer wavelength.

It is further possible to use a photonic crystal pattern for 1.55 micrometers wavelength and 0.7–0.8 micrometers periodic pitch along with the phase shift mask in accordance with the above novel multiple exposure method.

The above novel multiple exposure method may be used along with any other super resolution techniques such as zone illumination method.

Figure 18:
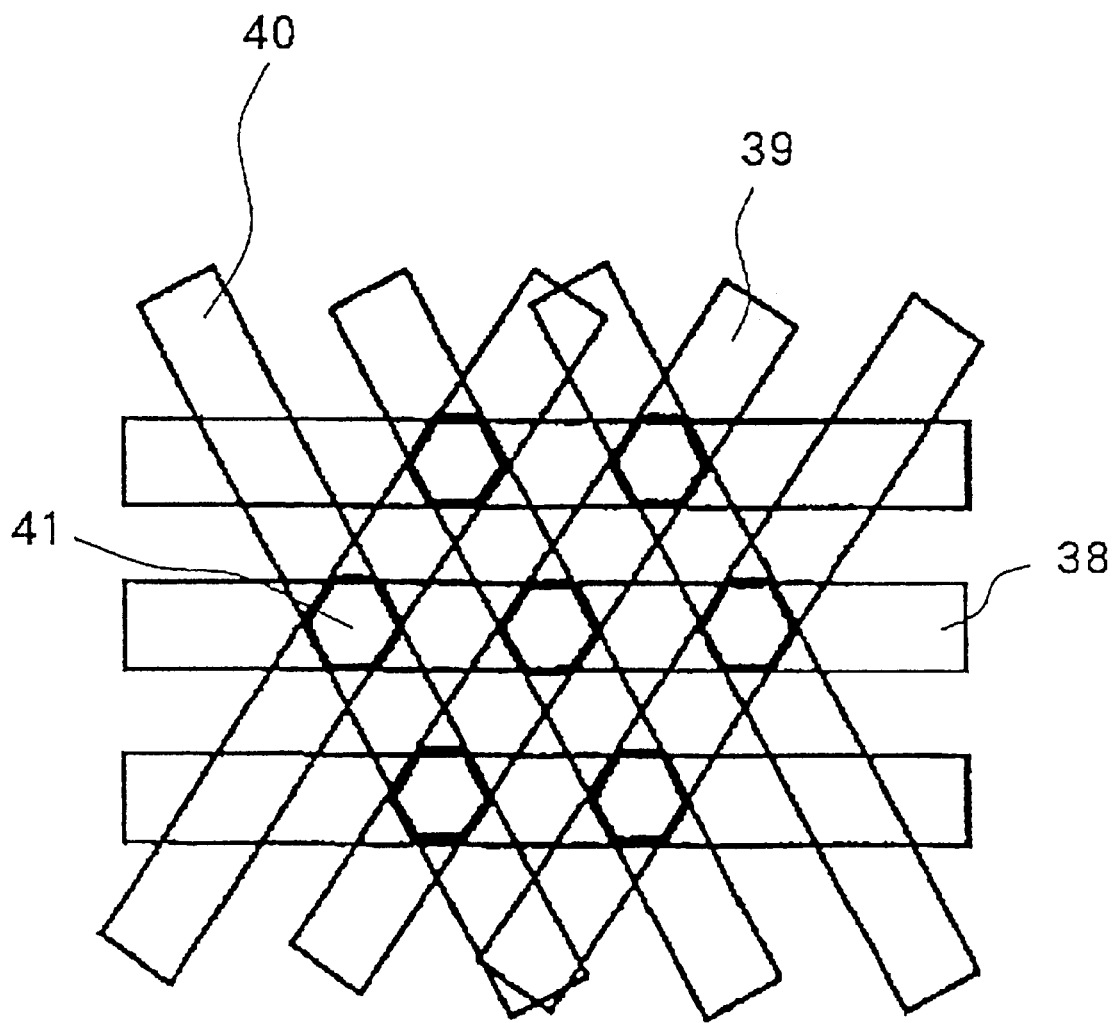
FIG. 18 is a diagram illustrative of three line-and-space patterns and triple-exposed portions in the tripe exposure method in order to form a hexagonal lattice pattern.

In the above embodiment, the dual exposures are used to form the fine lattice patterns. Triple or more exposures are of course applicable to form the fine lattice patterns. The use of the triple or more exposures makes it possible to close the shape of the lattice points toward circle. FIG. 18 is a diagram illustrative of three line-and-space patterns 38, 39 and 40 and triple-exposed portions 41 in the tripe exposure method in order to form a hexagonal lattice pattern. If the positive type photo-resist is used and only the triple-exposed portions 41 of hexagonal shape are sensitized by adjusting three exposure light quantities, the hexagonal lattice pattern can be obtained.

It is of course possible to select optimum one for the shape of the lattice points or the type of photo-resist.

In addition, the above dual exposure method provides a further advantage in that it is possible to form perfect lattice patterns even if alignments of the two times exposures are somewhat imperfect.

In addition, the above triple exposure method provides another advantage in that it is possible to obtain a large contrast in light intensity between triple-exposed parts and peripheral parts surrounding the triple-exposed parts, whereby more fine lattice points can be resolved.

It is preferable that the development process is carried out after all of the multiple exposure processes have been completed. It is, however, possible to carry out the development process and/or baking process between the multiple exposure processes.

Whereas modifications of the present invention will be apparent to a person having ordinary skill in the art, to which the invention pertains, it is to be understood that embodiments as shown and described by way of illustrations are by no means intended to be considered in a limiting sense. Accordingly, it is to be intended to cover by claims all modifications which all within the spirit and scope of the present invention.

What is claimed is:

1. A method of optical exposure of a two-dimensional lattice pattern to a positive type photo-resist, wherein at least two-time-sequentially separate overlapping exposures are performed without any optical interference and by using one-dimensional different patterns to produce the two-dimensional lattice pattern comprising a two-dimensional array of lattice-dots, wherein an exposure amount of each time of said at least two time-sequentially separate overlapping exposures is less than a critical exposure amount necessary for causing said positive type photo-resist to be soluble into a development, provided that at least two-times-overlap-exposed part has an exposure amount which is equal to or more than said critical exposure amount, and said least two-times-overlap-exposed part forms corresponding one of said lattice dots of said two-dimensional lattice pattern.

2. The method as claimed in claim 1, wherein said different patterns comprise line-and-space patterns.

3. The method as claimed in claim 2, wherein first one of said at least two time-sequentially separate overlapping exposures is carried out using first one of said line-and-space patterns which is in parallel to a first direction, and subsequently second one of said at least two time-sequentially separate overlapping exposures is carried out using second one of said line-and-space patterns which is in parallel to a second direction different from said first direction by an angle of 90 degrees, thereby to form a square-lattice pattern, which comprises plural dot-holes positioned at crossing points between spaces of said first line-and-space pattern and other spaces of said second line-and space-pattern.

4. The method as claimed in claim 2, wherein first one of said at least two time-sequentially separate overlapping exposures is carried out using first one of said line-and-space patterns which is in parallel to a first direction, and subsequently second one of said at least two time-sequentially separate overlapping exposures is carried out using second one of said line-and-space patterns which is in parallel to a second direction different from said first direction by an angle of 30 degrees, thereby to form a hexagon-lattice pattern, which comprises plural dot-holes positioned at crossing points between spaces of said first line-and-space pattern and other spaces of said second line-and-space pattern.

5. The method as claimed in claim 2, wherein first one of said at least two time-sequentially separate overlapping exposures is carried out using first one of said line-and-space patterns which is in parallel to a first direction, and subsequently second one of said at least two time-sequentially separate overlapping exposures is carried out using second one of said line-and-space patterns which is in parallel to a second direction different from said first direction by an angle of 60 degrees, thereby to form a hexagon-lattice pattern, which comprises plural dot-holes positioned at crossing points between spaces of said first line-and-space pattern and other spaces of said second line-and-space pattern.

6. The method as claimed in claim 2, wherein first one of said at least two time-sequentially separate overlapping exposures is carried out using first one of said line-and-space patterns periodically divided space patterns which are in parallel to a first direction, and subsequently second one of said at least two time-sequentially separate overlapping exposures is carried out using second one of said line-and-space patterns periodically divided space patterns which are in parallel to a second direction different from said first direction by an angle of 30 degrees, thereby to form a honeycomb-lattice pattern, which comprises plural dot-holes positioned at crossing points between spaces of said first line-and-space pattern and other spaces of said second line-and-space pattern.

7. The method as claimed in claim 2, wherein first one of said at least two time-sequentially separate overlapping exposures is carried out using first one of said line-and-space patterns periodically divided space patterns which are in parallel to a first direction, and subsequently second one of said at least two time-sequentially separate overlapping exposures is carried out using second one of said line-and-space patterns periodically divided space patterns which are in parallel to a second direction different from said first direction by an angle of 60 degrees, thereby to form a honeycomb-lattice pattern, which comprises plural dot-holes positioned at crossing points between spaces of said first line-and-space pattern and other spaces of said second line-and-space pattern.

8. The method as claimed in claim 2, wherein a plurality of said line-and-space patterns having partially divided space patterns are set to form a lattice pattern containing lattice defects.

9. The method as claimed in claim 1, wherein said at least two-time-sequentially separate overlapping exposures comprise three-time-sequentially separate overlapping exposures, and an exposure amount of each time of said three-time-sequentially separate overlapping exposures is less than a critical exposure amount necessary for causing said positive type photo-resist to be soluble into a development, provided that only three-times-overlap-exposed part has an exposure amount which is more than said critical exposure amount, and said three-times-overlap-exposed part forms a corresponding lattice dot of said two-dimensional lattice pattern.

10. The method as claimed in claim 9, wherein first one of said three-time-sequentially separate overlapping exposures is carried out using first one of said one-dimensional patterns which has a first spatial period in a first direction, and subsequently second one of said three-time-sequentially separate overlapping exposures is carried out using second one of said one-dimensional patterns which has a second spatial period in a second direction different by 60 degrees from the first direction, and subsequently third one of said three-time-sequentially separate overlapping exposures is carried out using third one of said one-dimensional patterns which has a third spatial period in a third direction different by 60 degrees from each of the first and second directions.

11. A method of optical exposure of a two-dimensional lattice pattern on a negative type photo-resist, wherein at least two-time-sequentially separate overlapping exposures are performed without any optical interference and by using one-dimensional different patterns to produce the two-dimensional lattice pattern comprising a two-dimensional array of lattice-dots, wherein an exposure amount of each time of said at least two time-sequentially separate overlapping exposures is less than a critical exposure amount necessary for causing said negative type photo-resist to be insoluble into a development, provided that at least two-times-overlap-exposed part has an exposure amount which is equal to or more than said critical exposure amount, and said least two-times-overlap-exposed part forms corresponding one of said lattice dots of said two-dimensional lattice pattern.

12. The method as claimed in claim 11, wherein said different patterns comprise line-and-space patterns.

13. The method as claimed in claim 12, wherein first one of said at least two time-sequentially separate overlapping exposures is carried out using first one of said line-and-space patterns which is in parallel to a first direction, and subsequently second one of said at least two time-sequentially separate overlapping exposures is carried out using second one of said line-and-space patterns which is in parallel to a second direction different from said first direction by an angle of 90 degrees, thereby to form a square-lattice pattern, which comprises plural dot-holes positioned at crossing points between spaces of said first line-and-space pattern and other spaces of said second line-and-space pattern.

14. The method as claimed in claim 12, wherein first one of said at least two time-sequentially separate overlapping exposures is carried out using first one of said line-and-space patterns which is in parallel to a first direction, and subsequently second one of said at least two time-sequentially separate overlapping exposures is carried out using second one of said line-and-space patterns which is in parallel to a second direction different from said first direction by an angle of 30 degrees, thereby to form a hexagon-lattice pattern, which comprises plural dot-holes positioned at crossing points between spaces of said first line-and-space pattern and other spaces of said second line-and-space pattern.

15. The method as claimed in claim 12, wherein first one of said at least two time-sequentially separate overlapping exposures is carried out using first one of said line-and-space patterns which is in parallel to a first direction, and subsequently second one of said at least two time-sequentially separate overlapping exposures is carried out using second one of said line-and-space patterns which is in parallel to a second direction different from said first direction by an angle of 60 degrees, thereby to form a hexagon-lattice pattern, which comprises plural dot-holes positioned at crossing points between spaces of said first line-and-space pattern and other spaces of said second line-and-space pattern.

16. The method as claimed in claim 12, wherein first one of said at least two time-sequentially separate overlapping exposures is carried out using first one of said line-and-space patterns periodically divided space patterns which are in parallel to a first direction, and subsequently second one of said at least two time-sequentially separate overlapping exposures is carried out using second one of said line-and-space patterns periodically divided space patterns which are in parallel to a second direction different from said first direction by an angle of 30 degrees, thereby to form a honeycomb-lattice pattern, which comprises plural dot-holes positioned at crossing points between spaces of said first line-and-space pattern and other spaces of said second line-and-space pattern.

17. The method as claimed in claim 12, wherein first one of said at least two time-sequentially separate overlapping exposures is carried out using first one of said line-and-space patterns periodically divided space patterns which are in parallel to a first direction, and subsequently second one of said at least two time-sequentially separate overlapping exposures is carried out using second one of said line-and-space patterns periodically divided space patterns which are in parallel to a second direction different from said first direction by an angle of 60 degrees, thereby to form a honeycomb-lattice pattern comprising plural dot-holes positioned at crossing points between spaces of said first line-and-space pattern and other spaces of said second line-and-space pattern.

18. The method as claimed in claim 12, wherein a plurality of said line-and-space patterns having partially divided space patterns are set to form a lattice pattern containing lattice defects.

19. The method as claimed in claim 11, wherein said at least two-time-sequentially separate overlapping exposures comprise three-time-sequentially separate overlapping exposures, and an exposure amount of each time of said three-time-sequentially separate overlapping exposures is less than a critical exposure amount necessary for causing said negative type photo-resist to be insoluble into a development, provided that only three-times-overlap-exposed part has an exposure amount which is more than said critical exposure amount, and said three-times-overlap-exposed part forms a corresponding lattice dot of said two-dimensional lattice pattern.

20. The method as claimed in claim 19, wherein first one of said three-time-sequentially separate overlapping exposures is carried out using first one of said one-dimensional patterns which has a first spatial period in a first direction, and subsequently second one of said three-time-sequentially separate overlapping exposures is carried out using second one of said one-dimensional patterns which has a second spatial period in a second direction different by 60 degrees from the first direction, and subsequently third one of said three-time-sequentially separate overlapping exposures is carried out using third one of said one-dimensional patterns which has a third spatial period in a third direction different by 60 degrees from each of the first and second directions.

* * * * *